US008902095B2

(12) United States Patent
Kanter et al.

(10) Patent No.: US 8,902,095 B2
(45) Date of Patent: Dec. 2, 2014

(54) PHOTONIC ASSISTED OPTICAL UNDER-SAMPLING WITH NON-UNIFORM SAMPLE INTERVALS

(75) Inventors: Gregory S. Kanter, Chicago, IL (US); Daniel Reilly, Chicago, IL (US); Shawn X. Wang, Temple City, CA (US)

(73) Assignee: Nucript LLC, Evanston, IL (US)

( * ) Notice: Subject to any disclaimer, the term of this patent is extended or adjusted under 35 U.S.C. 154(b) by 329 days.

(21) Appl. No.: 13/610,820

(22) Filed: Sep. 11, 2012

(65) Prior Publication Data

US 2013/0062508 A1 Mar. 14, 2013

Related U.S. Application Data

(60) Provisional application No. 61/533,577, filed on Sep. 12, 2011, provisional application No. 61/582,579, filed on Jan. 3, 2012.

(51) Int. Cl.
*H03M 1/00* (2006.01)
*H03M 1/12* (2006.01)

(52) U.S. Cl.
CPC .................................. *H03M 1/1265* (2013.01)
USPC .......................................... 341/137; 341/155

(58) Field of Classification Search
CPC .. H03M 1/1265; H03M 1/121; H03M 1/1066
USPC .................. 341/137, 155, 118, 120; 359/109
See application file for complete search history.

(56) References Cited

U.S. PATENT DOCUMENTS 6,658,181 B2 * 12/2003 Wang et al. ..................... 385/37
7,916,303 B2 *  3/2011 Ronnekleiv et al. .......... 356/477

* cited by examiner

*Primary Examiner* — Peguy Jean Pierre
(74) *Attorney, Agent, or Firm* — Nadya Reingand

(57) ABSTRACT

An apparatus and method are disclosed to digitize an input electrical signal. A sequence of nonuniformly spaced optical pulses impinges an optical modulator, where the pulses are modulated by the electrical input signal, the optical pulses being detected by one or more photoreceivers, the photoreceiver outputs being electrically sampled in analog-to-digital converters and then processed in a digital signal processor (DSP) in order to measure the electrical input signal. The series of nonuniform pulses are formed by interleaving L uniformly spaced pulse streams each of repetition period T and where $f_{max}$, the maximum allowable spectral frequency of the input electrical signal, is greater than $4 \cdot L \cdot f/2$, where $f=1/T$.

31 Claims, 6 Drawing Sheets

PHOTONIC ASSISTED OPTICAL UNDER-SAMPLING WITH NON-UNIFORM SAMPLE INTERVALS

CROSS-REFERENCE TO RELATED APPLICATIONS

This patent application claims priority to U.S. provisional application "Photonic assisted optical under-sampling with non-uniform sample intervals" No. 61/533,577 filed Sep. 12, 2011 and "System and method for improving performance of photonic samplers" No. 61/582,579 filed Jan. 3, 2012.

STATEMENT REGARDING FEDERALLY SPONSORED RESEARCH OR DEVELOPMENT

The United States Government has certain rights to this invention pursuant to contract No. FA9550-09-C-0153.

FIELD OF THE INVENTION

The present invention relates to a method of sampling and digitizing an analog signal, particularly when the signal has a low fractional bandwidth in relation to its central frequency. Such a function is commonly used in many fields including measurement/instrumentation, radio communications, and radar. The invention combines optical and electronic techniques in order to improve the resolution and the frequency range over which such sparse signals can be measured.

BACKGROUND

Analog-to-digital converters (ADCs) allow for an analog input signal to be sampled into the digital domain. ADCs have found wide-spread use in communications, as it allows the digitized signals to be processed with powerful digital signal processing (DSP) techniques. As electronic ADCs have developed, uses in RF-wireless communications such as cellular telephony and software defined radio have been made possible. ADCs in RF-wireless applications typically have high resolutions because bandwidth restrictions require the use of dense signal constellations. Other common uses for ADCs include instrumentation, such as high-speed real-time oscilloscopes, medical imaging, and radar.

Electronic ADC's have made steady technological progress, but issues such as clock-jitter and internal parameter mismatches make it difficult for ADCs to maintain high resolution as the sampling rate increases. It is common for ADC resolution to fall 1 bit for every factor of 2 rate increase.

Photonic technology can be used to aid in creating faster ADCs. The performance improvement is due to various factors depending on the specific design, but may stem, for instance, from the ability to generate ultra-short pulses with ultra-low timing jitter in the optical domain.

In addition to the standard Nyquist sampling, which is sampling at rates of at least two-times the highest frequency component of interest, there are times when subsampling or undersampling at lower sampling frequencies can be useful. Undersampling allows a very high carrier frequency to be digitized with a sample rate much less than twice the carrier frequency, but the sample rate must still be at least twice the total bandwidth the signal. This offers a possibility for simple, low cost, and low power consumption measurements of high frequency input signals. The low jitter and small aperture time of mode-locked lasers can be helpful in these applications. Although information over the signal bandwidth can be captured and digitized in this manner, there is information lost in the undersampling process. For instance, if the input frequency is simply a single frequency tone, then the measured carrier frequency of the signal is ambiguous. For some applications, measuring the carrier frequency or distinguishing between multiple frequencies is important. A method of undersampling with a nonuniform sampling period can resolve such ambiguities. One type of solution would be to use multiple optical wavelengths each having a different sampling frequency. This so-called compressive sampling regime has been demonstrated where the ambiguity can be resolved, including cases where there are multiple non-overlapping signal frequency bands to be measured. However, the cost and complexity of the scheme, as well as the complexity of the signal processing required (which slows down operation speed), may exclude it from many applications. Part of the expense is related to the need for the optical hardware, such as three separate optical pulse generators which may or may not require synchronization of their respective pulse rates. Synchronization adds additional expense to the system. In general optical ADC technology faces a cost hurdle since many types of implementations add substantial cost, size, and complexity in comparison to purely electronic ADCs. Thus finding simpler and lower cost implementations is of particular importance.

A method of pseudo-randomly sampling a signal, instead of using the more traditional periodic sampling, can also lead to resolving the ambiguity caused by under-sampling. The experimental realization of [10] uses optical sampling at pseudo-random sampling times to reconstruct the signal. However, the method used could be improved as to its complexity, cost, power consumption, and flexibility. For instance, in order to have fine resolution on the sampling time instances, the mode-locked laser must operate at a much higher repetition rate than the average sampling rate. This is non-optimal in terms of power consumption since almost all of the laser light is strongly attenuated to translate the high-rate optical pulses into a lower average rate pseudo-random stream of optical pulses. Also, it is difficult to change the time-grid which pulses are located on unless the mode-locked laser repetition frequency is widely tunable. Also, the high rate mode-locked laser is an expensive component. It's size, cost, and power consumption is often reduced in practice if passive mode-locking is used instead of active mode-locking, but many passive mode locking methods will not allow very high pulse repetition rates. The use of the external modulator adds cost, size, and power consumption in general. Employing lower rate mode-locked lasers or otherwise eliminating the high rate mode-locked laser is thus desirable.

It is known in the art that applying a high speed phase modulation to a pulse train can shift the pulse train's optical frequency or correspondingly its optical wavelength. Such a function has not previously been used in a photonic ADC.

What is needed is a photonic ADC capable of high resolution for signals with high carrier frequencies. Ideally it should be possible to determine from the digitized signal the input carrier frequency to a high accuracy over a very large frequency range. The configuration should be simple, robust, and low cost. Other practical concerns such as size, weight, and power consumption are also important and should be reduced if possible. It is useful it the system has a self-calibration and self-monitoring function to optimize and monitor the system performance in order to allow for very high resolution performance with modest component costs. It is advantageous if the nonuniform nature of the pulse sequence can be modified or reprogrammed by the user to suit a given input signal.

SUMMARY

We describe an ADC system which is inherently robust and capable of high resolutions when undersampling sparse signals that may have a fractional bandwidth much less than their carrier frequency. The system makes use of non-uniform sample times based on nonuniform optical sampling pulses. The nonuniform pulses can be generated by various means, including the use of a single wavelength laser with a pulse repetition rate f followed by a delay-and-recombine temporal pulse multiplexer which effectively interleaves L uniform pulse streams. The interleaving is such that the arrival of pulses is no longer uniform, but instead slightly displaced from uniform. For the case of interleaving L pulse streams, the (L−1) different interleaving delays can be set to $j \cdot T/L + \tau_j$, where j is an integer ranging from 1 to (L−1), T=1/f is the laser repetition period and each $|\tau_j|$ is small relative to T/L, typically smaller than T/(2·L). Particularly when the system is used to measure the frequency of a finite number of input frequency tones, the magnitude of at least one $\tau_j$ is also constrained to be larger than approximately $$\frac{\pi}{\sqrt{2M} \cdot 2^{ENOB} \cdot f},$$

where M is the number of samples that are made during the measurement interval at the original pulse repetition frequency f, ENOB is the effective number of bits of the signal samples, and C is a design constant that is typically in the range of [1,5]. In general it is also useful if the magnitude of the $\tau_j$'s are greater than the optical pulsewidth and greater than $\sim 1/(2 \cdot L \cdot f_{max})$, where $f_{max}$ is the highest input frequency the input signal can have. The invention can be used to significantly expand the range of input frequencies that can be measured with low ambiguity, which if the pulses are configured to be uniform would have been L·f/2. Thus since $f_{max}$ is equal to or larger than the unambiguous frequency range it is expected that $f_{max}$ is large such as $f_{max} > 4 \cdot L \cdot f/2$, which is strongly undersampled. The sequence of now nonuniform pulses sample an input electrical signal which modulates the pulses via an optical interferometric modulator. The optical interferometer outputs are photodetected then digitized using electrical ADCs. In some cases the electrical ADCs can be clocked with a uniform electrical clock created by multiplying the laser repetition rate clock, while in other cases a nonuniform ADC clock can be created by directly measuring the nonuniform pulses using an optical-to-electrical detector. The digitized signals are processed in a digital signal processor (DSP) to determine the sampled input signal. To optimize the signal processing parameters, a calibration signal can be digitized and the resulting digitized signal quality evaluated. The frequency of the calibration signal can be highly stable, such as if it is generated in a Rubidium oscillator, thus allowing for the determination of the pulse repetition rate and the pulse sequences' nonuniform temporal spacing pattern. Some subset of DSP processing parameters can also be determined by processing the input signal itself, by modifying the subset of processing parameters such that the processed samples from the optical interferometer lie on a unit circle. The method allows for nonuniform sampling using a pulsed source of fixed repetition rate and without requiring wavelength filtering. Information such as the input frequency of an input signal that has much higher carrier frequency range than the corresponding uniform sampling Nyquist frequency range of L*f/2 can be obtained using this method without a substantial increase in the cost or power consumption of the system. This is particularly true when there are two or more interleaving delays, especially if the interleaving delay offsets ($\tau_j$'s) have a ratio that is nearly the same as a ratio of relatively prime integers.

Typically the ADC system makes use of an optical interferometric modulator with multiple output ports where an optical phase-modulator is included in one of the arms of the interferometer in order to transfer the input signal to be analyzed from the electrical to the optical domain. The optical interferometric modulator ideally contains a combiner that combines the optical signal in two arms of the interferometer such that they have a relative combining phase that differs from IC, such as a 90° or 120° relative phase, as can be realized with an optical hybrid or 3×3 coupler, respectively. The output ports from the interferometer are detected with photoreceivers, sampled with electronic ADCs, and the ADC outputs are sent to a digital signal processor (DSP). The DSP evaluates a given number of samples over a sampling time interval and derives information about the input signal, potentially including the input signal's mean frequency over the sampling time interval. The sampling time interval and correspondingly the number of samples processed in one measurement can be adaptively chosen in order to meet desired constraints for a given input signal ENOB, sampling frequency f, and minimum delay τ.

The number of samples evaluated by the DSP can be adaptively selected based on the qualities of the input signal, which can be estimated by tapping off part of the input electrical signal to a power meter to evaluate the input signal size, or by evaluating the characteristics of an initial small set of samples. For instance the small subset of samples can be used to estimate the signal size and therefore the signal effective number of bits (ENOB), and the number of samples processed can be chosen adaptively according to a constraint on t, such as $$|\tau_j| > \frac{C}{\sqrt{2M} \cdot 2^{ENOB} \cdot f}$$

where C is a constant greater than 1 and M is the number of samples processed. In some cases t can itself be modified by the system in addition to or instead of M to meet desired constraints given the expected input signal.

An alternative way to generate nonuniform samples is to pass a laser pulse stream through a phase modulator acting as an optical frequency shifter then pass the frequency shifted pulses through a dispersive element. This technique can be used by itself or combined with passive delay/recombine to create a rich variety of sample times that appear to have a pseudo-random component. The pseudo-random temporal shifts are useful in resolving ambiguities that can result for nonuniform sample times with simpler relationships such as when using two interleaved pulse streams of frequency f=1/T with an interleaving delay of time of T/2+τ. The optical frequency shifter can be realized by a phase modulator driven with a sinusoidal driving modulation frequency that is at a frequency m·f+f/k, where m and k are integers in order to frequency shift an input pulse sequence in a temporally varying manner. The driving modulation frequency can be derived by filtering the photodetected sequence of input pulses by band pass and or low pass filters to generate locked signals at for instance m·f and f, processing the signal at f in a frequency divider to generate a frequency at f/k, then combining m·f and f/k in a mixer to generate m·f+f/k. The frequency shifted input optical pulse sequence is sent through a dispersive element to convert the temporally varying frequency shift into a temporally varying time shift. In so doing the pulse sequence obtains a wider variety of inter-pulse delays thereby increasing the degree of nonuniformity of pulse sequence which is useful in measuring unknown input signals.

The nonuniform optical pulse sequence can consist of pulses of a plurality of wavelengths, including the case where the a plurality of interleaved pulses at a plurality of input wavelengths are generated, sent through an optical interferometric modulator, separated at the optical outputs of the optical interferometric modulator into a plurality of outputs of different wavelength by a wavelength division multiplexer (WDM), detected by optical photodetectors, digitized by electrical ADCs, and processed by a DSP. The pulse interleaving can be performed by a WDM based temporal interleaver. In the WDM case L interleaved pulse streams are interleaved by (L−1) interleaving delays between a reference interleaved pulse stream and the (L−1) other interleaved pulse streams. The (L−1) different interleaving delays can take on a wider range of values than the non-WDM case, but at least one of the interleaving delays fall outside the range $j*T/L \pm (\frac{1}{2} \cdot L \cdot f_{max})$ where j is an integer from 1 to (L−1), thereby excluding uniform sampling. In the case where the system is used to measure the frequency of a discrete number of input frequency tones, one of the interleaving delays should be larger than approximately $$\frac{c}{\sqrt{2M} \cdot 2^{ENOB} \cdot f}.$$

If there are multiple interleaving delays, it is useful if at least two have a ratio that is approximately the same as a ratio of two relatively prime integers. The method of increasing the diversity of pulse sequence locations using a frequency shifter followed by a dispersive element can also be applied to the WDM pulse sequence.

The proposed method of producing the optical input source is inherently compatible with opto-electronic integration since many of the components are common optical elements. Because of the calibration and control mechanism, the system is robust to parameter mismatches and performance drift that may occur when building an optical circuit instead of using individually optimized components. A design that is compatible with integration is desirable in terms of size, weight, and cost.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments. In general, features described in one embodiment might be suitable for use in other embodiments as would be apparent to those skilled in the art.

Figure 1:
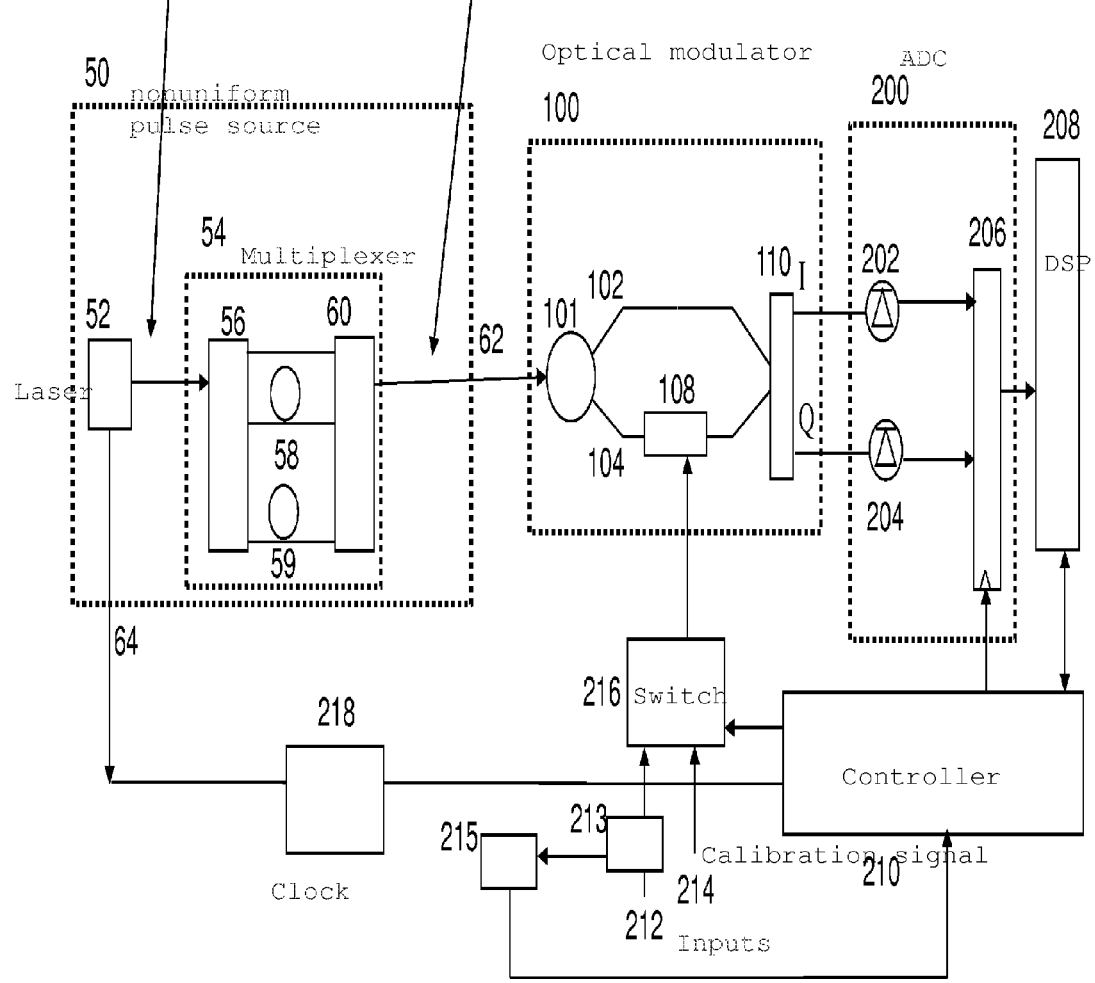
FIG. 1 Nonuniformly sampled optical ADC with three interleaved uniform sampling streams.

An embodiment of a photonic-assisted nonuniformly sampled photonic ADC architecture is shown in FIG. 1. It combines a nonuniform optical pulse source 50, an optical interferometric modulator 100, an optical signal digitization block 200, and a digital signal processing unit (DSP) 208. A controller 210 may be used to aid in system control and calibration. The DSP and controller are both essentially digital processors, but for explanatory purposes we separate the function of typically high-rate processing of the DSP from lower-rate processing and control by the controller. A signal switch 216 can optionally be configured by the controller to select the radio frequency (RF) or microwave frequency (MF) input signal to be digitized (heretofore called the input signal) from a plurality of signal switch inputs 212,214, where some of the switch inputs may be used specifically for calibration purposes which are hence referred to as calibration signals. Alternatively a separate phase modulator or a separate input to the optical phase modulator 108 can be integrated into the optical interferometer to apply the calibration signal, where the calibration signal magnitude can be set by the controller.

A pulsed optical signal is created by a nonuniform optical pulse source 50. The nonuniform optical source contains a uniform optical pulse generator as can be realized by a mode locked laser 52 producing optical pulses at a repetition frequency f thus a pulse-to-pulse time period of T=1/f, mean optical wavelength λ, and with a pulse width $\tau_{pulse}$. The uniform pulses are passed through a passive temporal-multiplexer 54 which in this embodiment is created by splitting the uniform optical signal in a first optical coupler 56, delaying each of the three outputs of the coupler by a different amount by adding a first relative delay using a first delay element 58 of delay time T/3+$\tau_1$ and a second relative delay using a second delay element 59 of delay time 2·T/3+$\tau_2$ to two of the three first optical coupler outputs, where the delay element can be realized by a length of optical fiber, and recombining the three pulse streams in a second optical coupler 60. Note that in general the τ's can be positive or negative, and $\tau_{1,2}$=0 represents uniform sampling at a sample rate of 3·f.

In FIG. 1 the first optical coupler has three outputs, thus the average pulse arrival frequency will be effectively tripled. It is possible to have more coupler outputs, generally L outputs where L is an integer leading to yet higher average repetition rates of L·f and (L−1) different delay times. The temporal multiplexer could also be constructed by a series of optical coupler and delay stages to form more complex output pulse sequences or by other temporal multiplexes such as those based on polarization delay, as would be apparent to one skilled in the art. The signal exiting the temporal multiplexer is a sequence of optical pulses with an average repetition rate of 3·f, where the first two pulses are spaced by T/3·$\tau_1$, and the first and third pulses are separated by 2·T/3+$\tau_2$ as shown in FIG. 1. It expected that a typical configuration will have |τ|'s substantially smaller than T/3, such as smaller than ½ the size of T/3. One reason why |τ| is chosen to be much smaller than T/L is that the optical signal digitization block must have sufficient bandwidth to accurately measure neighboring pulses and as |τ| approaches T/L the time separation between two neighboring pulses will approach zero. If the system bandwidth allows τ to be set to as large as ~0.5·T/L then the system could have been designed with a small τ and a modified repetition period T'~T/2 which would lead to improved instantaneous bandwidth, making small values of τ preferred. In general a system with L interleaved uniform pulse streams will have L−1 adjustable delays of $\tau_j$ where j is an index referring to each of the [1 to L−1] possible delays and each will typically be smaller than (½)·T/L.

The nonuniform optical pulse sequence 62 enters an optical interferometric modulator 100, which in this case makes use of an I/Q combiner 110 (90° relative phase difference between the combined inputs at the two output ports) although other combiners such as a standard 50/50)(180° combiner could be used to create alternate interferometric modulators such as the Mach-Zehnder type, with such a change requiring minor modifications that would be apparent to one skilled in the art. It is the preferred embodiment to use a combiner that has a combining phase other than 180°, ideally 90°, since this preserves all phase information. The interferometric modulator splits the nonuniform optical pulse sequence 62 in an optical splitter 101 into two paths 102 and 104. One path propagates through an optical phase modulator 108, which is realized by an electro-optical phase modulator that transfers an electrical input voltage into an optical phase shift on the input optical pulse stream. The I/Q combiner 110 combines the pulses from the two optical paths of the interferometer into two outputs (I and Q) that are detected and digitized by the optical signal digitization block 200. The optical signal digitization block contains two photoreceivers 202, 204 each having electrical outputs. Note that all the optical pulses in the pulse sequence are the same wavelength and the optical spectrum from the laser does not need to be modified by optical filters before detection. Each of the photoreceivers 202,204 thus detects all the nonuniform optical pulses. The lack of wavelength division multiplexing (WDM) filtering in this embodiment is an advantage in terms of simplicity and preservation of the inherent low jitter properties and short pulse width of the mode locked laser 52.

The photoreceiver electrical outputs are digitized by electrical ADCs 206. The electrical ADCs are clocked at a rate of 3·f, where the clock signal is generated by passing the clock output 64 of the mode locked laser which is at the same frequency as the laser pulse repetition rate through the clock processor 218, where in this case the clock processor is a simple frequency tripler. The resulting 3·f frequency is phase shifted in the controller 210 so that the clock signal arrives at the ADCs synchronously with the optical pulses. The use of a clock of a uniform clock frequency (3·f) is convenient since no further processing of the clock frequency other than the simple frequency multiplier (tripler) is needed. In general more sophisticated clock processing may be required to account for the nonuniform nature of the pulse arrival. One method to acquire a nonuniform clock for clocking the ADCs synchronous with the nonuniform optical pulse sequence would be to optically detect the nonuniform optical pulse sequence using an optical detector and use the resulting electrical output as an ADC clock signal. The embodiment of FIG. 1 does not require this added complexity because t is small enough that a uniform clock allows the ADCs to sample the signal adequately. If the impulse response of the optical signal digitization block is much greater than τ, for instance 10 times greater, then it is likely that a uniform clock will function adequately especially after calibration. The impulse response can be approximated as 0.4/BW where BW is the detection bandwidth. The BW should also be well above L·f so that the pulses can be individually detected without much interference. Say we have f=100 MHz and L=3, then we can for instance choose a bandwidth of 800 MHz so that the inpulse response is about 500 ps. Thus if all the τ's are less than or about 50 ps then a uniform clock would be appropriate. If not then a portion of the nonuniform optical pulse stream can be tapped off and sent to an optical photo-detector to generate a nonuniform ADC clock.

The controller 210 can communicate with a DSP block 208 which receives the digitized signal from the optical signal digitization block 200. The information from the DSP allows the controller to determine the optimal sampling phase. For instance the controller can change the sampling phase and observe the peak-to-peak sampled signal size from the DSP, then choose the sampling phase with the largest signal size. The laser electrical clock output 64 can optionally be split and sent to a frequency counter (not shown) so that the mode-locked laser repetition rate f can be precisely measured. This is useful if f has a slow drift so that the DSP 208 can know the actual frequency f of the laser at any time and use the actual value of f to determine accurate information about the applied signal to be digitized, such as its exact RF frequency.

The optical phase modulator 108 optionally receives its modulation signal from a signal switch 216. The signal switch selects one of a plurality of its inputs 212, 214 to send to the phase modulator as the RF modulation voltage which is sampled and digitized by the system. One input to the RF selector is the input signal 212 to be digitized, which in this case is passed through an optional power monitor 213 that estimates the input signal power and sends the input signal to the signal switch. Another input to the signal switch can be a calibration signal 214, for instance from an oscillator. The controller 210 which can be realized by a microcontroller selects which of the inputs to the RF selector are sent to the phase modulator as the signal to be digitized (RF modulation voltage). The optical signal after the phase modulator carries a phase modulation that is linearly related to the RF modulation voltage. The calibration signal 214 can be a signal of a precisely known frequency such as the sine wave from a Rubidium (Rb) oscillator. Note that the use of a highly stable Rb oscillator of precisely known output frequency can be used in lieu of the aforementioned frequency counter in order to determine the repetition frequency of the mode locked laser. Say the laser repetition frequency is actually f+δf, where f is the long term average frequency of the mode locked laser and δf is the small instantaneous frequency deviation from f. Since the Rubidium oscillator frequency calibration signal is known with a high level of precision, δf can also be calculated with a high level of precision. For instance, say f=100 MHz, δf=100 Hz, and $f_{in}$=10 MHz (in this case $f_{in}$ is the Rubidium oscillator frequency but more generally it is the signal that is applied to the phase modulator). Examining only the uniformly spaced pulses separated by T, one can calculate the value off, using the frequency translation equation $f_{in}$= (N+(N mod 2))·$f_{applied}$+(1−2*(N mod 2))·$f_{IF}$, where here $f_{applied}$=(f+δf) is the instantaneous repetition frequency of the mode locked laser during the measurement time interval, $f_{in}$ is the frequency of input RF signal to the phase modulator in Hz, $f_{IF}$ is the measured intermediate frequency (IF) or under-sampled frequency in units of Hz (ranging from [0 to $f_{applied}$/2]), f+δf is the laser pulse repetition rate in Hz, and N is an integer representing the Nyquist region where the measurement is made $$N \equiv \left\lfloor \frac{f_{in}}{f_{applied}/2} \right\rfloor.$$

In this case N=0 since the input frequency is lower than ½ the sample rate. In the case where N=0 the IF frequency in π radians/sample multiplied by (f+δf) should equal $f_{in}$. Therefore, since $f_{in}$ is known precisely and the IF is measured, the frequency deviation δf can be determined. Note that if δf is not determined precisely, it will have an adverse affect on the measured value of an unknown $f_{in}$, as can be seen by inspecting the frequency translation equation.

The same calibration signal can be used to determine system parameters for performance optimization. Various system parameters such as the relative scale of the I and Q outputs and the inherent phase bias between the two arms of the interferometer can be determined and used by the DSP so as to optimize the ENOB of the samples by optimizing the quality of the digitization of the known calibration signal. These parameter values can then be used to evaluate an input signal of unknown characteristics. From a series of n observed I and Q samples labeled x[n] and y[n], respectively, we can calculate corrected digital samples $x_c$[n] and $y_c$[n] using: $x_c$[n]=x[n]*$x_{scale}$+$x_{off}$−cos($\theta_m$[n]+$\theta_b$[n]) and $y_c$[n]=y[n]*$y_{scale}$+$y_{off}$=cos($\theta_m$[n]+$\theta_b$[n]+$\theta_{hyb}$) where $\theta_m$[n] and $\theta_b$[n] are discrete-time samplings of the modulator and bias phases (modulator phase is linearly related to the applied voltage sent to the optical phase modulator at time sample n), respectively, and $\theta_{hyb}$ is the combination phase of the optical hybrid combiner which is nominally 90°, and x,$y_{scale}$ are scaling parameters while x,$y_{off}$ are offset parameters in the x and y channels, for instance due to differences in gain or voltage offset in the respective ADC's. Applying a trigonometric identity to x, and y, and rearranging the terms yields:

$$y_h[n] = \frac{x_c[n]\cos(\theta_{hyb}) - y_c[n]}{\sin(\theta_{hyb})} = \sin(\theta_m[n] + \theta_b[n]),$$

where $y_h$[n] is a hybrid phase corrected digital signal. In principle these equations can be used to find the total phase between the two interferometer arms using a two parameter arctangent function. However, if (during the sampling interval) the magnitude of $\theta_m$[n]+$\theta_b$[n] exceeds π, then the phase angle will wrap and the result will be discontinuous. For this reason, the signal processor approximates the average value of the slowly-moving phase bias $\theta_{bm}$≈<$\theta_b$[n]> and subtracts it from the total phase term so as to maintain phase continuity over the maximum dynamic range. This can be implemented in the DSP by computing: $x_r$[n]=$x_c$[n] cos($\theta_{bm}$)+$y_h$[n] sin($\theta_{bm}$); $y_r$[n]=−$x_c$[n] sin($\theta_{bm}$)+$y_h$[n] cos($\theta_{bm}$), allowing for a straightforward calculation of $\theta_m$[n] by: $\theta_m$[n]=arctan($y_r$[n], $x_r$[n]) by using the two-parameter arctan function arctan(sin(θ), cos(θ))=θ|−π<θ<=π. The scatterplot of $x_r$ and $y_r$ should be on the unit circle if the various parameters such as the offset parameters are correct. In many cases, the bias phase $\theta_{bm}$ may be approximated as π away from the center of the region on the unit circle that is absent of samples, although more sophisticated tracking might be required for large signals with sparse IQ scatter plots. In such cases, information such as the distribution of measured phase values (for instance a histogram of the phase measurements) can be used to estimate the phase bias or the input signal can be set to zero by the signal switch to directly measure the phase bias. The hybrid phase parameter is typically stable over time, thus only needs to be measured once. In contrast the offset and scale parameters may need to be recalibrated over time due to issues such as laser power drift and a change in the offset due to the effect of a change in received optical power on an AC coupled photoreceiver. The scale parameters typically change slowly, so they may be calibrated together with any of the unknown parameters periodically by using a nonlinear fitting function to optimize the ENOB of the digitized calibration signal. For this calibration to be accurate, it is useful to have a known calibration signal of high modulation index. The offset and bias phases, which may change on a faster time scale, can be recalibrated more often if necessary using the input signal to be digitized itself instead of switching to the calibration signal. This simpler recalibration can be performed by choosing the offset parameters to optimize the placement of the processed $x_r$ and $y_r$ samples on a unit circle and choosing the bias phase $\theta_{bm}$ to be π radians away from the center of the region on the unit circle that is absent of samples. Since only a subset of the processing parameters are readjusted it is not necessary to use a known calibration signal since even a small non-sinusoidal signal will suffice to determine the parameters of interest. We note that when interleaving the L uniform pulse streams using a temporal multiplexer, it is also likely that the each of the interleaved pulse streams will have slightly different scale and offset parameters. Thus the scale and offset parameters can be determined for each pulse stream independently. To accurately determine the large number of initial parameters including the interleaving phase (time delay between the pulse streams) a known calibration signal is useful.

A example of a method to find an unknown RF input carrier frequency when it is composed of a single sinusoid is described. If the Nyquist region N=integer(2·$f_{in}$/f) is known, the applied microwave frequency $f_{in}$ can be determined with high accuracy (thus labeled $f_{fine}$) using any one of the interleaved uniform sample pulse trains via:

$$f_{fine} = A \cdot \frac{f}{2} + q \cdot f_{IF}$$

where if N is even A=N and q=+1 while if N is odd A=N+1 and q=−1. Thus it is useful to determine N for unambiguous frequency measurements since if no information about N is known then there exist on the order of $N_{range}$ possible candidate frequencies where $N_{range}$=integer(2·$f_{max}$/f) integer (2·$f_{min}$/f) and where $f_{max}$ ($f_{min}$) is the maximum (minimum) input signal frequency in the range of allowed input frequencies. N can be estimated by considering the phase difference dϕ$_j$ between the IF frequency of sampling stream j and the undelayed stream chosen here as a reference. First we compute $$P_P \equiv \left(\left(\frac{2\pi \cdot j \cdot f_{IF}}{f \cdot L} - d\phi_j + \frac{\pi}{L}\right) \bmod \frac{2\pi}{L}\right) - \frac{\pi}{L}.$$

If P>0 we conclude that N is even, and if P<0 we conclude N is odd. To find a course estimate of the input frequency ($f_{coarse}$) we use $$f_{coarse} = \frac{|P|}{2\pi\tau_j}.$$

Finally we estimate N using $$N = \begin{cases} 2*\text{round}((f_{coarse} - f_{IF})/f) & \text{for } N \text{ even} \\ 2*\text{round}((f_{coarse} + f_{IF})/f) - 1 & \text{for } N \text{ odd} \end{cases}$$

where round represents rounding to the nearest integer.

Figure 2:
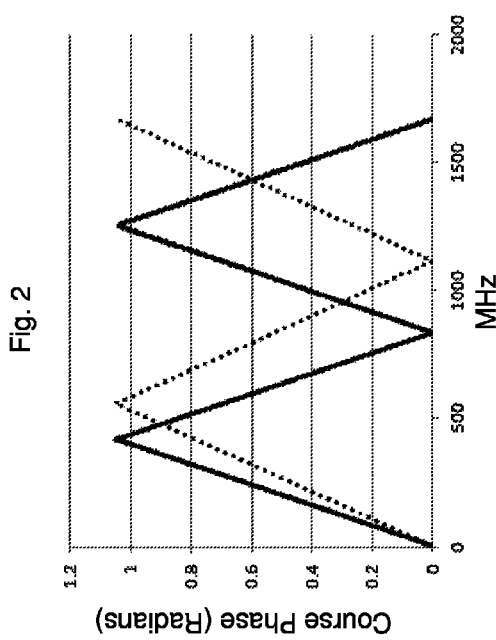
FIG. 2 Plot of the course phase ($d\phi_x$) as a function off, for two different interleaving delay values (solid: interleaving delay=T/3+400 ps, dotted: interleaving delay=2·T/3+300 ps). Using both measured course phase values together allows the determination off, with a high probability over a range of 1.6 GHz.

The method as described will operate with a low probability of ambiguity (an ambiguity arises when more than one possible $f_{fine}$ is valid with a single $f_{in}$ frequency input) over a range of frequencies $f_{range,j}=1/(2 \cdot L \cdot \tau_j)$. It is advantageous to have a wide operating frequency range which encourages the use of a small $\tau$. However, given a fixed error in $d\phi_j$ a smaller $\tau$ leads to a larger error in $f_{coarse}$. The frequency recovery algorithm used here requires that the absolute value of the error on $f_{coarse}$ be less than f/2, so $\tau$ should be chosen appropriately. Combining the two constraints $\tau$ should satisfy $$\frac{\Delta(d\phi)}{\pi f} < \tau,$$

where $\Delta(d\phi)$ is the maximum expected error in $d\phi$. A plot of $f_{coarse}$ as a function of $f_{in}$ is shown in FIG. 2 where $\tau_1$=300 ps and $\tau_2$=400 ps and f=50 MHz. The $f_{range}$ calculation so far is simply the maximum frequency range in the zig-zag plot where the slope is either purely positive or purely negative. Over this range for either coarse phase $d\phi_j$ where j=1 or 2 there is a one-to-one correspondence between $f_{in}$ and $d\phi_j$, or in other words no inherent ambiguity problem even if just one of the two $d\phi_j$ plots are used. In FIG. 2 the maximum frequency range using just one $d\phi_j$ is 1/(2·3·300 ps)~555.6 MHz. This is already a substantial improvement over the 3*50 MHz/2=75 MHz that would be allowed by uniform sampling. However, we can greatly extend the range of frequencies for which there is a low probability of ambiguity by using both $d\phi_j$ curves simultaneously. We can extend the frequency range to $f_{range}'$~$L_1*f_{range,1}$~$L_2*f_{range,2}$ by selecting $f_{range,1}/f_{range,2}$~$L_2/L_1$ where $L_1$ and $L_2$ are relatively prime integers. So FIG. 2 has an actual frequency range $f_{range}'$ of ~3*555.6 MHz or 1.67 GHz. Note that $f_{max}$ can be much larger than $f_{range}$, with the maximum frequency typically limited by the other factors such as the optical pulse width, optical pulse jitter, or bandwidth of the phase modulator.

We can approximate the relationship of the rms frequency error of $d\phi_{j,RMS}=\sigma_{d\phi}$ to ENOB and sample size (for M samples analyzed) analytically as $$\sigma_{d\phi} \sim \frac{1}{\sqrt{2M} \cdot 2^{ENOB}}$$

by using typically statistical methods, such as the well known inverse relationship between the standard deviation of the average of M samples and $1/\sqrt{M}$. For measuring unambiguous frequencies with the method described the $\tau$ value should be set to a level that will allow the recovery algorithm to reliably operate. We can estimate a safe $\tau$ by setting $\Delta(d\phi)$ equal to $C \cdot \sigma_{d\phi}$ where C is a constant chosen so that it is very unlikely the measured phase error will exceed $\Delta(d\phi)$. We can re-write the constraint on $\tau$ that stems from the $d\phi$ measurement error as $C/(\sqrt{2M} \cdot 2 \cdot \text{ENOB} \cdot f) < \tau$. For instance, assuming Gaussian statistics the maximum error will exceed 3 times the standard deviation about 0.1% of the time. In practice C will typically be a number in the range of {1-5}. If we select C=3, and take ENOB=7, f=100 MHz, M=750, and L=2 then we could set $\tau$ to as low as 6 ps leading to $f_{range}$~41 GHz. This offers a greatly expanded frequency measurement range compared to the 100 MHz afforded by uniformly multiplexing two uniform 100 MHz sampling streams into a 200 MHz sampling stream. However, the $f_{range}$ value attainable is dependent on the ENOB and number of samples processed. The expansion of the maximum measurement frequency range is one of the benefits of the method, and it is thus anticipated that the method would be most profitably used when $f_{range}$ is substantially greater than the L*f/2 range afforded by uniform sampling. Since $f_{max}$ is generally greater or equal to $f_{ranges}$, we also expect $f_{max}$ to be much greater than L*f/2, for instance 4 or more times greater. This puts the system in the undersampling regime. Typically one would also choose $\tau$ to be at least as long as the optical pulsewidth since this allows the measured sample to be independent from the sample that would have occurred had uniform sampling taken place.

Assuming $\tau$ is fixed and ENOB is an uncontrollable property of the input signal, the system can choose M to satisfy the aforementioned $\tau$ constraint. For instance, a small subset of 100 samples can be evaluated in order to determine phase modulation range of the signal which can be used to estimate the ENOB since ENOB is proportional to the input signal power in dB units when ENOB is limited by the input signal-to-noise ratio. The number of samples M evaluated during the input frequency reconstruction algorithm can then be selected so as to satisfy the constraint. For instance, if $\tau$ is set to ~6 ps but ENOB drops down to just 4 bits, then M should be expanded to ~49,000 to maintain a 41 GHz $f_{range}$. Of course, choosing a larger M requires a longer measurement time interval which may be undesirable. If the laser repetition rate f is variable, it too could be adjusted so that the constraint is satisfied for some value of M, although the tuning range off is not likely to be large in practice since a user will likely choose a f nearly as high as possible given the bandwidth of the photoreceiver and electrical ADCs being used. A more flexible way to meet the constraint would be to make one or more of the $\tau$ values variable, as can be realized by using a variable delay line (say if 58 is a variable delay line under the control of the control unit 210). In addition to changing $\tau$ to meet the desired constraints, $\tau$ can also be reprogrammed if the input signal frequency happens to be a value that leads to potential ambiguity. Some potential ambiguity problems will be discussed later, but generally frequency ambiguities lie on specific frequencies for a given zig-zag plot such as FIG. 2, and by changing $\tau$ the zig-zag plot also changes thus shifting the ambiguous frequency points away from the input frequency.

The ability to adaptively change M, f, and or τ to satisfy the aforementioned constraint on τ or to change f or τ to resolve frequency ambiguities is thus a desirable feature of the invention.

Another way to determine the input signal modulation size (thus infer the ENOB) is to tap off a part of the input signal in an electrical tap 213 and send the tapped signal to a power monitor 215. In this way, the ENOB can be estimated without processing of the signal samples. The use of a power monitor also allows for a consistency check between the inferred power of the sampled signal and the power measured at the power monitor. For instance, if the input signal samples show no variation (above the noise floor) this could mean there is no input signal, or it could mean that the input signal is at a precise integer multiple of the sample rate f. Using a power monitor can determine which of cases is actually occurring. Moreover, if the size of the phase modulation imparted by the input signal is known then by observing the phase difference between the nonuniform samples a single input sinusoid frequency can be measured even if the input signal is near a multiple of f. Combining a power monitor and undersampler thus allows more information about the signal to be obtained. If the results from the power monitor and the undersampled signal are consistent then there is a higher degree of confidence that the signal has been measured accurately.

Figure 3:
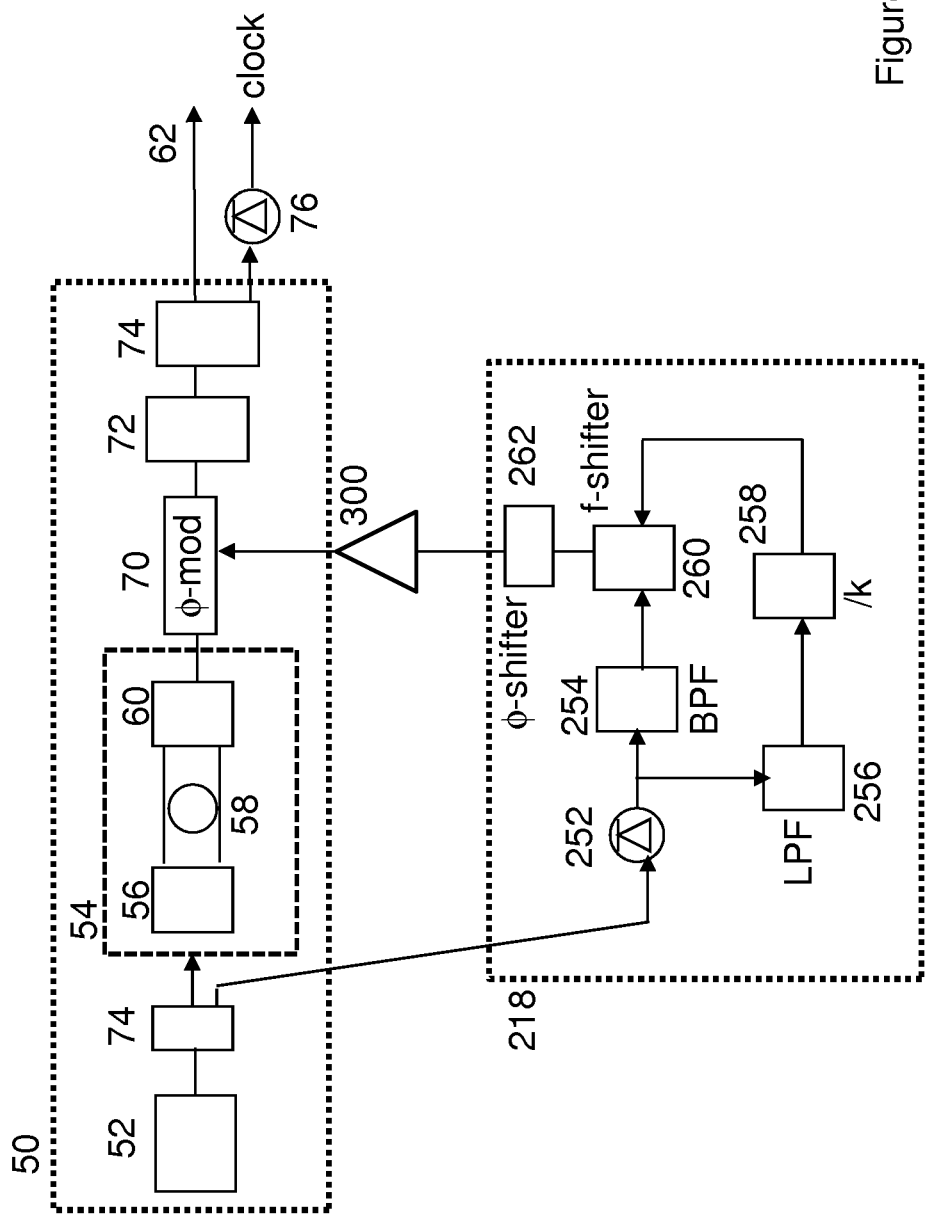
FIG. 3 Nonuniformly sampled ADC using a frequency processing block to generate a driving frequency for a phase modulator in order to dynamically shift the optical frequency of input optical pulses, where the frequency shifted pulses are translated into temporally shifted pulses after propagation through a dispersive element.

A different embodiment of the nonuniform pulse generator is shown in FIG. 3. This embodiment has a nonuniform pulse generator 50 that includes a temporal multiplexer 54, an optical frequency shifter realized by an optical phase modulator 70, and a dispersive element 72. A portion of the uniform pulses from the mode locked laser 52 is split off in an optical tap 74, and processed by a frequency processor block 218. The frequency processor block contains a photoreceiver 252 that sends its electrical output to both a band pass filter (BPF) 254 and a low pass filter (LPF) 256. The band pass filter selects the mth harmonic frequency where m is an integer, for instance if m=200 and f=100 MHz then the mth harmonic frequency is 20 GHz. A suitable BPF would have a pass band of 20 GHz and a bandwidth of less than 100 MHz so as to reject the m−1 and m+1 harmonics. The mth harmonic is then sent to an electrical frequency shifter 260, such as an electrical mixer with a post-mixer filter to select the appropriate mixing term. The low pass filter 256 selects the fundamental frequency of 100 MHz and sends this fundamental frequency to a frequency divider 258 realized by an electrical counter which divides the fundamental frequency by an integer k. The divided signal is sent to the electrical frequency shifter 260 and the electrical frequency shifter then outputs a frequency of m*f+(f/k). There are other methods to generate a locked frequency of m*f+(f/k), for instance using electronic phase locked loops. The method described is desirable since it leverages the low jitter nature of the mode locked laser and generates a frequency precisely locked to the mode locked laser repetition rate f.

The output from the electrical frequency shifter is phase shifted by a controlled amount by an electrical phase shifter 262, amplified in an amplifier 300, then used as the electrical driving signal to the optical frequency shifter realized by an optical phase modulator 70. The optical phase modulator 70 thus applies a time varying phase shift that corresponds to a frequency shift of the incoming pulses. The frequency shift depends on the relative temporal position of the optical pulse with respect to the electrical driving signal. The dispersive element 72 converts this time varying frequency shift (which varies depending on pulse location) into a variable temporal shift. This converts the uniform pulses that propagate through each arm of the temporal multiplexer into nonuniform pulse streams Note that the temporal multiplexer can be removed and the uniform pulse stream from the mode locked laser can be made nonuniform by the combined action of the frequency shifter and the dispersive element, although the temporal multiplexer adds more control over the types of nonuniform pulse streams attainable. Alternatively other types of nonuniform pulse sequences including wavelength interleaved nonuniform pulses could be processed into more complex pulse arrival streams using the frequency shifter. A second optical tap 74 taps off a portion of the nonuniform optical pulse sequence 62 that is sent to the optical interferometer and subsequent processing blocks (similar to FIG. 1) and converts it to a nonuniform electrical clock using a clock recovery photoreceiver 76. This nonuniform clock can be used for clocking the electrical ADCs in the subsequent optical signal digitization block. Directly detecting the ADC clock signal is useful if the nonuniform optical pulse outputs deviate too much from a uniform output such that the ADCs cannot effectively sample at the center of all the detected pulses when using a uniform clock. Note that although there is a slight wavelength shift between the various nonuniform pulses, the photorecievers as before detect all the nonuniform pulses.

As an example we can choose m=200 and k=5 and use a single delay T/2+τ between two interleaved uniform pulse streams. The optical frequency shift pattern (thus the temporal shift pattern after the dispersive element) will repeat every 5 uniform pulses from each uniform pulse streams (or every 10 total pulses). Longer or shorter patterns can be chosen by changing k. The pulse repetition rate is 100 MHz so T=10 ns. The electrical driving signal to the phase modulator 70 is at a frequency of $f_d$=200*100+(100/6) 20.0167 GHz. The magnitude of the applied phase shift is such that when the optical pulse is aligned for the maximum (minimum) frequency shift the optical frequency shift is +100 GHz (−100 GHz). We can label the pulses $P_n$ where n is the pulse index. We can write the frequency shift of each of the odd-indexed pulses ($P_n$=1, 3, 5 . . . ) as 100 GHz*sin $\{2*\pi*(P_n-1)*(T/2)*f_d+\phi_a\}$ and the frequency shift of each of the even-indexed pulses as 100 GHz*sin $\{2*\pi*(P_n-1)*(T/2)*f_d+\phi_a+2*\pi*\tau*f_d\}$, where $\phi_a$ is the phase of $f_d$ at the time of pulse index 1. $\phi_a$ can be controlled by changing the phase shift of the RF phase shifter 262 between the frequency shifter 262 and the phase modulator 70. The controller 210 can be connected to the RF phase shifter to adjust $\phi_a$ as needed.

Figure 4:
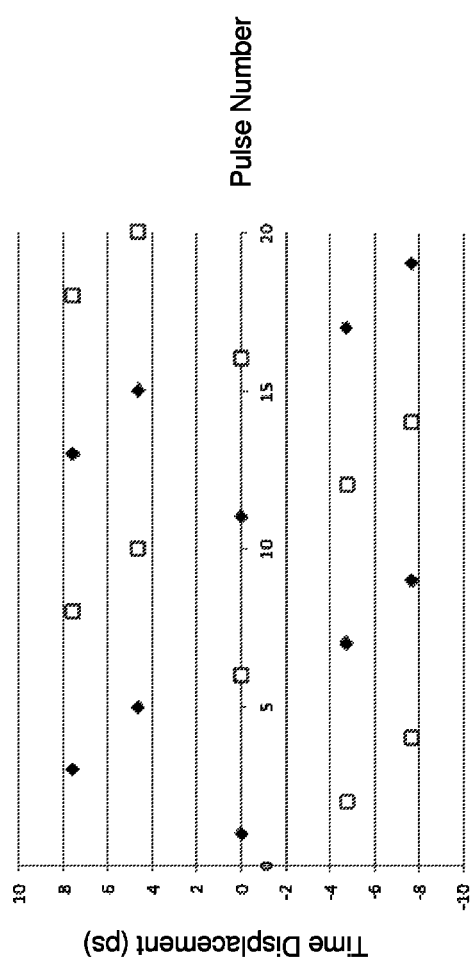
FIG. 4: Expected temporal displacement for an example in the text as a function of the pulse index number. The even (open squares) and odd (filled triangles) pulse index numbers represent the two interleaved pulse streams.

FIG. 4 shows the time displacement of each pulse from the two interleaved uniform pulse streams (if all time displacement equal 0 then it would correspond to each of the interleaved pulse streams being on the uniform grid of period T and interleaved by a delay of T/2+τ) when a dispersive element of 0.08 ps/GHz is used and $\phi_a$=0 radians and the τ=25 ps. The time displacement sequence repeats every 10 total pulses. Although the time displacement for the odd and even pulse indexes each follow a sinusoidal pattern, the overall time displacement appears pseudo-random when plotted versus pulse index. Longer pseudo-random time displacement patterns can be made by choosing a larger k. The frequency shifter and dispersive element combination thus adds more control over the variation in the sampling times which can be helpful for extracting more information from the nonuniform samples such as unambiguously determining the carrier frequency of an RF input sinusoid. As will be described later, some small probability of an ambiguous input frequency can remain when nonuniformly undersampling an input frequency. This can be mitigated by recording samples with more varied temporal positions. For instance, if more than one candidate frequency is possible using a more regular nonuniform pulse sequence, then the correct frequency can be determined by finding which candidate frequency best matches a nonuniform pulse sequence that is varied slightly in terms of pulse positions.

The magnitude of the maximum frequency shift of the pulses and thus the corresponding time displacement is related to the size of the phase shift generated by the electrical driving signal. Thus it can be changed by changing the amplification of the amplifier 300. Also, the precise frequency shift pattern is dependent on m and k, which are engineering choices that can be changed as desired, for instance by using a programmable frequency divider and a tunable band-pass filter in the frequency processor block 218. Thus the shifting pattern can be reprogrammed based on the input signal or the user's needs, and the reprogramming can be done adaptively based on prior measurements. The reprogramming capability of the shifting pattern is an advantage of this embodiment. It is also advantageous if the programmed shifting pattern can be measured, which is possible by nonuniformly sampling the known calibration signal such as a Rb oscillator. Essentially, every 2*k change in pulse index will sample the calibration signal at a rate of f/k with a measurable relative IF phase shift with respect to a different starting pulse index which reveals the relative pulse temporal displacement.

Figure 5:
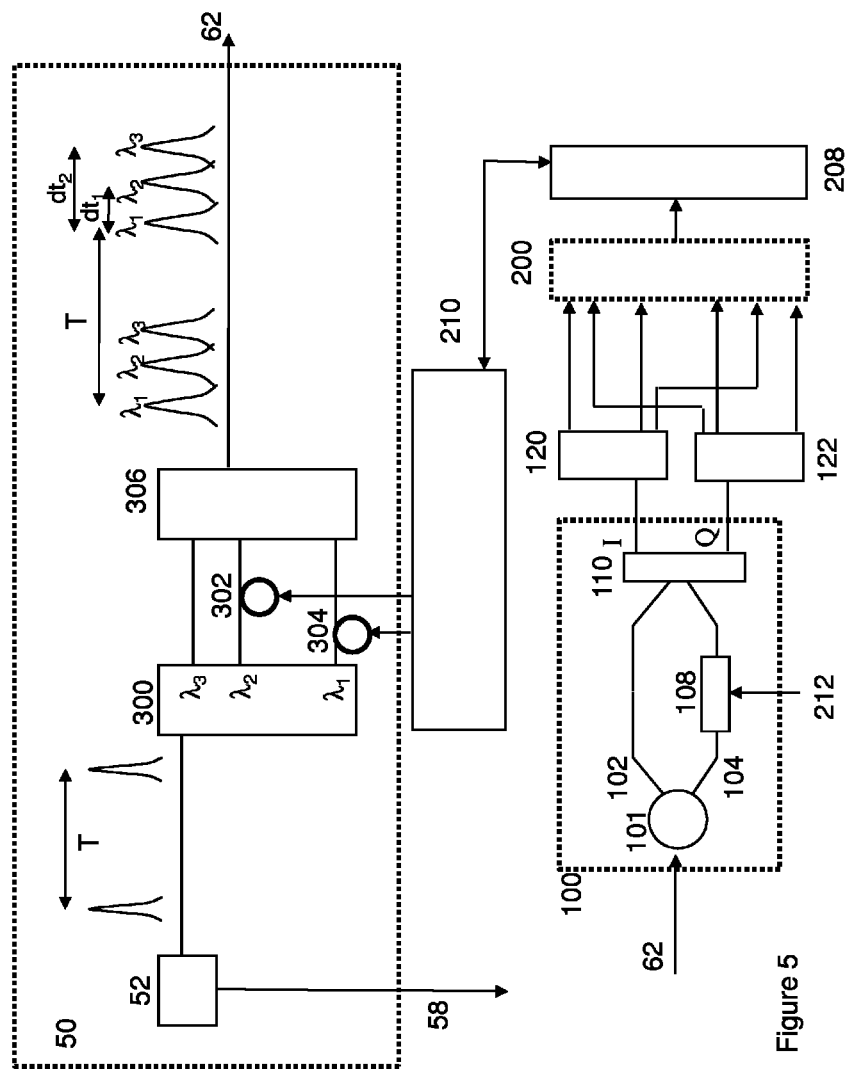
FIG. 5: Multi-wavelength nonuniformly sampled ADC.

FIG. 5 depicts a different embodiment that shows the use of a WDM split-and-recombine method to create offsets between pulses of different wavebands. Because the pulses are separable by wavelength, they can be placed very close together while still allowing low rate ADCs to sample the photodetected signals, which gives more control over the placement of the pulses than the single wavelength case. The use of different ADCs to detect pulses of different wavebands allows for higher sample rates than would otherwise be possible. However, more ADCs and WDM filtering is needed. A WDM demultiplexer 300 splits the uniform input pulse stream from a mode locked laser 52 into three wavebands labeled $\lambda_1$, $\lambda_2$, and $\lambda_3$. Variable delay lines 302,304 control the delay between the pulses of each waveband relative to the others before recombining them in a WDM multiplexer 306. The variable delay lines could also be fixed delay lines, but the variable delay lines that have their delay amount controllable by the control unit 210 have the benefit of allowing for adaptive selection of the delay amounts based on measured input signal information or the expected characteristics of the input signal. The output pulses at each of the wavebands are at the same sample rate f. We choose the pulse at waveband $\lambda_1$ to be a reference pulse, with relative delays of $dt_1$ and $dt_2$ between the pulses at $\lambda_1$ and $\lambda_2$ and the between the pulses at $\lambda_1$ and $\lambda_3$ as shown in FIG. 5. The rest of the system is similar to FIG. 1, except I/Q WDM demultiplexers 120,122 are located after the I/Q coupler 110. The WDM demultiplexers split each of the wavebands into different output ports, each of which is detected using different photoreceivers in the subsequent optical digitization block 200. Thus each detector now only detects a specific wavelength at a repetition rate 1/T. The relative delays are chosen so that the interleaved pulse sequence is not uniform. To specify the nonuniform nature of the pulse sequence, we define a time scale of $t_{scale} \sim 1/(2 \cdot f_{max})$, where $f_{max}$ is the highest spectral frequency the input signal can have. At least one of the dt values should be greater than $t_{scale}$. At least one of the dt values should not be in the range of $j \cdot T/L \pm t_{scale}/L$, where j is an integer in the range of [1,L−1]. These limitations will be discussed in more detail later.

This system can be used for non-uniform sampling, for instance to find an input RF carrier frequency with a low probability of ambiguity. A method to find the RF input carrier frequency is as follows. Note that the method can be extended to find a finite number of simultaneous input RF carrier frequencies as well. If the Nyquist region N=integer $(2 \cdot f_{in}/f)$ is known, the applied microwave frequency can be determined with high accuracy (thus labeled $f_{fine}$) using one of the uniform sample pulse trains at a single waveband via:

$$f_{fine} = A \cdot \frac{f}{2} + q \cdot f_{IF},$$

where if N is even A N and q=+1 while if N is odd A=N+1 and q=−1. Thus N should be determined for unambiguous frequency measurements. This is accomplished by observing the phase difference between the wavebands:

$$d\phi_x = \mathrm{mod}(\phi_{x+1} - \phi_1 + \pi, 2\pi) - \pi$$

where $\phi_x$ is the phase of the IF frequency at wavelength $\lambda_x$, and in this case x=1 or 2 depending on the phase being analyzed. We can coarsely calculate the resulting frequency as:

$$f_{coarse,x} = \frac{|d\phi_x|}{2\pi \cdot dt_x}$$

and $f_{coarse}$ can then be used to estimate N using:

$$N \approx 2 \cdot \mathrm{round}\left(\frac{f_{coarse} + z \cdot f_{IF}}{f}\right) + C,$$

where if $d\phi_x > 0$ then z=−1 and C=0 (otherwise z=+1 and C=−1) and round represents rounding to the nearest integer.

Figure 6:
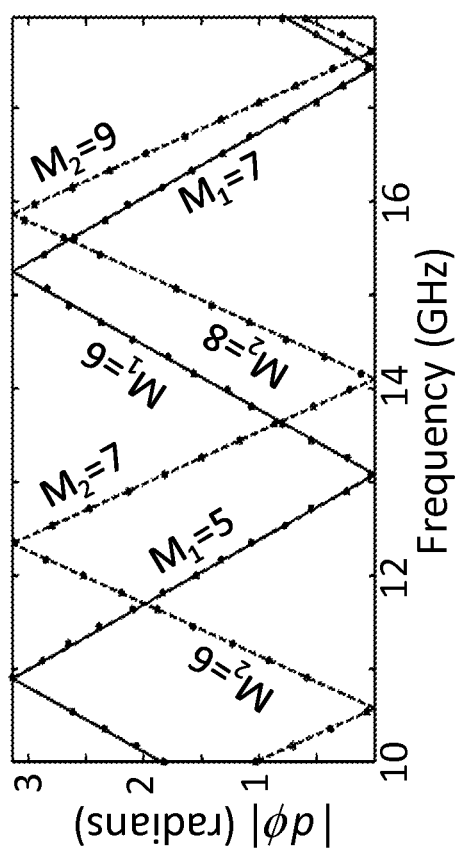
FIG. 6 Plot of how the pulse-to-pulse phase varies with frequency for $M_1$ (solid line) and $M_2$ (dashed line) using an example explained in the text.

For a two spectral-band experiment (only two wavelengths with a single delay, such as by detecting only $\lambda_1$ and $\lambda_2$) there is a single $dt_1$ and $d\phi_1$ value and the maximum unambiguous frequency range is $f_{dt-nyq,x} = 0.5/dt_1$. We can think of $f_{dt-nyq}$ as the "Nyquist range due to pulse delay" since a series of uniform samples spaced at $dt_1$ would have a Nyquist frequency of $f_{dt-nyq}$. FIG. 6 shows at how $d\phi$ varies with $f_{in}$ for two different wavebands (x values). The details of FIG. 6 will be described later, but the zig-zag nature of the plot where the slope suddenly changes from positive to negative is evident, and the range over which the slope is either positive or negative is $f_{dt-nyq}$. Over this range, there is a one-to-one correspondence between $f_{in}$ and $d\phi$ for a given x index, or in other words no inherent ambiguity problem even for a single dt (just two spectral bands). The range of frequencies for which there is a low probability of ambiguity is $f_{range} \geq 0.5/dt_{min}$ where $dt_{min}$ is the smallest dt value of all the spectral bands. We will see that $f_{range}$ can be expanded but the expanded $f_{range}$ is a multiple $f_{dt-nyq}$ and so preserving the largest possible $f_{dt-nyq}$ is desirable. A wide frequency range for the input signal thus encourages the use of a small dt. However, given a fixed measurement error in $d\phi$ a smaller dt leads to a larger error in $f_{coarse}$. The frequency recovery algorithm we describe requires that the error on $f_{coarse}$ must be less than f/2, so dt should be chosen appropriately. Combining the two constraints at least one of the dt values should satisfy $$\frac{\Delta(d\phi)}{\pi f} < dt,$$

where $\Delta(d\phi)$ is the maximum expected error in $d\phi$. We will see that $\Delta(d\phi)$ can be made very small by accumulating enough samples. Thus one can ask if there is a lower limit on dt that is more generally valid regardless of the number of samples processed. This can be approximated by noting that for any system there is a maximum expected input frequency $f_{max}$. To minimize error while maintaining a frequency range equal to $f_{max}$ allows us to set $dt_{min} \geq 0.5/f_{max}$. A very wide band phase modulator might have $f_{max} \sim 100$ GHz, making $dt_{min} \geq 5$ ps. We note that it is possible to space the nonuniform WDM pulses in a nearly uniform way with the pulses having only small temporal offsets from uniform locations, analogous to the single wavelength embodiment of FIG. 1, but in such a case using similar processing as was done in the single wavelength case suggest that the small temporal offsets from uniform spacing should be $$\gtrsim \frac{0.5}{L \cdot f_{max}}.$$

A two wavelength system was built with a laser repetition rate f=50 MHz to demonstrate the simultaneous unambiguous measurement of multiple input frequencies. We can also approximate the relationship of $\sigma_{d\phi}$ to ENOB and sample size (for M samples analyzed) as we did previously $$\sigma_{d\phi} \sim \frac{1}{\sqrt{2M} \cdot 2^{ENOB}}$$

The system is designed so that the dt value is not less than a level that will allow the recovery algorithm to reliably operate. We can estimate a safe dt by setting $\Delta(d\phi)$ to $C \cdot \sigma_{d\phi}$ where C is a constant chosen s$_o$ that it is very unlikely the measured phase error will exceed $\Delta(d\phi)$. If we select C=3, then for this example we could set $dt_1$ to as low as 96 ps leading to $f_{range}$=5.2 GHz. This offers a greatly expanded frequency measurement range compared to the 25 MHz afforded by uniform 50 MHz sampling. The expansion of the possible frequency range is one of the benefits of the method, and it is thus anticipated that the method would be most profitably used when $f_{range}$ is substantially greater than the range afforded by uniform sampling, for instance 4 or more times greater. We can re-write the constraint on dt that stems from the $d\phi$ measurement error as $$\frac{C}{\sqrt{2M} \cdot 2^{ENOB} \cdot f} < dt.$$

Assuming that ENOB is an uncontrollable property of the input signal, the system can choose M or f so as to satisfy the constraint. For instance, a small subset of 100 samples can be evaluated in order to determine phase modulation size and thus estimate the ENOB. The number of samples M evaluated during the input frequency reconstruction algorithm can then be selected so as to satisfy the constraint. Of course, choosing a larger M then requires a longer measurement time interval. If the dt value is determined by a variable delay line 304 under the control of a control unit 210, then the delay of the delay line can be changed if necessary to satisfy the constraint. The ability to adaptively change M or dt to satisfy a constraint on dt is thus a desirable feature of the invention.

In the experiment we set the dt to 193.4 ps, which was selected for experimental convenience and should lead to a frequency measurement range of 2.58 GHz. Two RF sinusoids of different amplitude were simultaneously applied to the system, one at 5.001 GHz and another at a frequency that was swept from 1 GHz to 2 GHz in steps of 57.1 MHz. After acquiring 2080 samples we fit a sinusoid to the samples, subtracted the ideal fit from the samples, then repeated the fitting procedure on the residual to determine the smaller magnitude frequency and its amplitude. We then iterated the procedure and subtracted the smaller magnitude fit from the original samples to determine the larger magnitude signal with greater accuracy. The fixed tone was measured to a 50 Hz rms error and the variable tone to a 100 Hz rms error, demonstrating the capability to distinguish multiple frequency tones with a high frequency measurement resolution and wide frequency operating range of the system.

Since the smallest dt that should be used can depend in part on the ENOB of the input signal (since the ENOB will affect the rms phase error $\sigma_{d\phi}$) the dt value can be adaptively chosen based on the measured or expected characteristics of the input signal. For instance, the input signal ENOB is typically related to the input signal modulation size (typically 6 dB more signal increases ENOB by 1 bit). The input signal modulation size can be estimated during the measurement, for instance by the DSP determining the peak to peak phase shift applied during the measurement period. The DSP communicates the signal size (estimated ENOB) information with the control unit. Thus, if the dt value is too small for the given signal then the control unit can change the variable delay line to increase dt and the measurement can be remade. If the dt value is much larger than it needs to be, then it can be reduced in order to increase the frequency measurement range. Adaptively selecting the dt value based on the expected or estimated properties of the input signal is beneficial for maintaining the optimum operating frequency range.

For the three-wavelength WDM system an experiment was performed with delays of $dt_1$=229 ps and $dt_2$=284 ps. The dt's are selected so that $L_1/(2dt_1) \approx L_2/(2dt_2) \approx f_{max}$ where $L_1$=4 and $L_2$=5 are integers chosen to be relatively prime leading to an enhanced frequency measurement range $f_{range} \sim 8.8$ GHz. This represents the range over which the input frequency can vary while still being resolvable with a low probability of ambiguity. With such a choice one can expand the frequency measurement range well beyond what is possible with a single dt. Although neither $dt_1$ or $dt_2$ specify the frequency uniquely, they do with high probability when analyzed together. A procedure for determining f is to first determine $d\phi_1$ and $d\phi_2$, then estimate the course frequency using:

$$f_{coarse,x} = \frac{(M_x + K)\pi + j|d\phi_x|}{2\pi dt_x}$$

where $M_x$ is the Nyquist region due to pulse delay, which is the integer part of $f_{in}/f_{dt-nyq,x}$ and if mod($M_x$,2)=0 then K=0 and j=1 (otherwise K=1 and i=−1). Since $f_{in}$ is not yet known we evaluate the set of possible $M_1$ and $M_2$ values and choose the set that makes $f_{coarse,1}$ and $f_{coarse,2}$ as close as possible. The sizes of the sets of possible $M_1$ and $M_2$ values are $L_1$ and $L_2$, respectively, and are further constrained for our system in the targeted 10-18 GHz measurement range since here $M_1$+1 ≤ $M_2$ ≤ $M_1$+2. We changed the input frequency from 10.001 GHz to 17.965 GHz in steps of 181 MHz during the experiment. Additional information on $f_{in}$, such as could be supplied by a low resolution frequency measurement instrument using delay line phase discriminators, can be used to further constrain the possible values of $M_x$. The mean $f_{coarse}$ value is then used to determine N, but since we are interested in a range of frequencies that covers more than one Nyquist range due to pulse delay we modify the equation for estimating N by considering the Q value:

$$Q = y \oplus \left( \mathrm{mod}\left( \left\lfloor \frac{f_{coarse}}{f_{dt-nyq,x}} \right\rfloor, 2 \right) \right)$$

where y is 1 if $d\phi_x > 0$ and y is 0 otherwise. When Q=1 z=−1 and C=0 (otherwise z=+−1 and C=−1). With N known either $d\phi_1$ or $d\phi_2$ can be used in (1) to find $f_{in}$. Using the frequency determination algorithm and assuming that candidate frequencies that differ by >3.5 GHz can be resolved with a low-resolution technique, we find the method determines the correct frequency in all 45 measurements with an rms frequency error of 262 Hz (106 Hz) when analyzing 4 μs (40 μs) of samples.

There are a few frequencies in the $f_{range}$ interval that require a special note. Firstly, there are $L_1 * L_2 + 1 - L_1 - L_2$ ambiguous frequencies that can lead to two possible candidate frequencies. This is because on a "zig-zag" plot of the $|d\phi|$ values such as is plotted in FIG. 6, certain pairs of $|d\phi_1|$ and $|d\phi_2|$ occur at two frequencies which are at integer multiples of $f_{max}/(L_1 * L_2)$. For instance, both 10.186 GHz and 14.553 GHz lead to similar $d\phi_1$ and $d\phi_2$ values. However, such candidate frequencies differ by at least $1/(2 \sim dt)$, where dt is the larger of $dt_1$ or $dt_2$. This encourages the use of small dt values to make the candidate frequencies suitably different so that they can be easily resolved using low-resolution frequency measurement methods, and to help keep the $L_1$ and $L_2$ integers small so as to minimize the number of ambiguous frequencies. Ambiguities can also be resolved by modifying one or more of the dt values or modifying f slightly so that the ambiguous frequencies occur at different frequencies. Some mode locked lasers have a fixed frequency f, so it is often easier in practice to change dt using a variable delay line. Secondly, the error of $f_{coarse}$ can be large if the corresponding $d\phi$ is near 0 or π. In these cases, we use only the more accurate $f_{coarse,x}$ instead of averaging both into the result. We treated $d\phi$'s within a range of ±0.05 radians from 0 or π this way. Thirdly, any frequency that is close to an integer multiple of $f_{laser}/2$ is problematic because after undersampling the resulting sinusoid changes phase very slowly (at exactly an integer multiple the phase is constant). This situation can be resolved for instance by altering the laser repetition rate slightly. Or, as was shown in FIG. 3, the samples can be further shifted in time in a pseudo-random way, for instance using a frequency shifter followed by a dispersive element. This would help to eliminate potentially ambiguous frequencies as any potential frequencies can be compared using the more varied nonuniform sample instances and the one with the closest match to the actual samples would be the correct potential frequency.

What is claimed is:

1. An apparatus for digitizing an input electrical signal, comprising: an optical modulator to modulate a sequence of nonuniformly spaced optical pulses by the electrical input signal, the optical pulses being detected by one or more photoreceivers, the photoreceiver outputs being electrically sampled in analog-to-digital converters (ADCs), the samples being processed in a digital signal processor (DSP) in order to measure the electrical input signal, the series of nonuniform pulses being L interleaved uniformly spaced pulse streams each of repetition period T and where $f_{max}$ the maximum allowable spectral frequency of the input electrical signal, is greater than $4 \cdot L \cdot f/2$, where f=1/T.

2. The apparatus of claim 1, wherein the (L−1) different relative delays associated with L interleaved pulses are $\tau_j + (j \cdot T/L)$, where j is an indexing integer that ranges from 1 to (L−1) and the different $\tau_j$ delay values have an absolute magnitude smaller than $T/(2 \cdot L)$ and at least one has an absolute magnitude larger than or approximately equal to $1/(2 \cdot L \cdot f_{max})$.

3. The apparatus of claim 1, wherein the optical modulator is an optical interferometric modulator with at least two optical outputs, the optical interferometric modulator including an optical phase modulator.

4. The apparatus of claim 3, wherein a known electrical calibration signal is applied to the optical interferometric modulator, detected by the photoreceivers and digitized by the DSP, and whereas processing parameters that are used by the DSP to convert the ADC samples into the measured electrical input signal are determined by processing the known calibration signal.

5. The apparatus of claim 4, wherein a subset of the processing parameters determined by processing the known calibration signal are further adjusted by processing samples of the input electrical signal itself, wherein the subset of processing parameters are adjusted so that the processed samples of the input signal optimally lie on a unit circle.

6. The apparatus of claim 1, wherein electrical sampling clock to the ADCs is at a uniform frequency of $L \cdot f$.

7. The apparatus of claim 1, wherein an electrical sampling clock to the ADCs is a nonuniform signal derived by photodetecting the nonuniform optical pulsesequence.

8. The apparatus of claim 1, wherein the sequence of nonuniform optical pulses are generated by sending a uniform pulse stream through a temporal multiplexer that separates and recombines multiple copies of the uniform pulse stream with each copy delayed by a different delay value, and all the pulses in the resulting nonuniform pulse sequence being detected by each of the photoreceivers.

9. The apparatus of claim 8, wherein at least one the delay values is variable and can be reprogrammed.

10. The apparatus of claim 1, wherein two of the delays $\tau_a$ and $\tau_b$ are approximately related as $i_1/\tau_a \sim i_2/\tau_b$, where $i_1$ and $i_2$ are relatively prime integers.

11. The apparatus of claim 1, where M samples of the input signal are used to determine a fixed number of input frequency tones on the input signal, where at least one $|\tau_j|$ is not less than $$\frac{1}{\sqrt{2M} \cdot 2^{ENOB} \cdot f},$$

where ENOB is the effective number of bits per sample, M is the number of samples processed in the DSP during a measurement interval, and f is 1/T.

12. The apparatus of claim 11, wherein the ENOB of the input signal is estimated by processing a limited number of initial samples and the estimated ENOB is used to determine the number M of samples to process.

13. The apparatus of claim 11, wherein the ENOB of the input signal is estimated by tapping off a portion of the input signal to a power monitor.

14. The apparatus of claim 1, wherein a portion of the input signal is tapped off and sent to a power monitor whose power measurement can be checked against the sampled signal for consistency.

15. The apparatus of claim 1, wherein the nonuniform pulse sequence is further temporally shifted in a pseudo-random way by applying a time varying frequency modulation to the pulse sequence then passing the frequency modulated pulse sequence through a dispersive element, where pseudo-random time shifts are used to help resolve signal ambiguities that can occur during nonuniform sampling.

16. An apparatus for generating a nonuniform output optical pulse sequence for the purpose of sampling an input signal at nonuniform sample times, comprising: an input uniform or nonuniform pulse sequence is frequency shifted in an optical frequency shifter, the optical frequency shifter applying a frequency shift that varies over the sequence of optical pulses, the time varying optical frequency shifted pulse sequence passing through a dispersive element to convert the time varying optical frequency shift into a time varying temporal displacement.

17. The apparatus of claim 16, wherein the input pulse sequence to be frequency shifted is itself a nonuniform input pulse sequence created by interleaving a plurality of uniform pulse streams with a plurality of time delays using a temporal multiplexer, and the generated nonuniform output optical pulse sequence arrival times after the optical frequency shifter and dispersive element are shifted in a time varying way with respect to the nonuniform input pulse sequence.

18. The apparatus of claim 16, wherein the input pulse sequence consists of interleaved pulse sequences of a plurality of wavelengths.

19. The apparatus of claim 16, wherein the optical frequency shifter includes an optical phase modulator driven by an electrical modulation signal.

20. The apparatus of claim 19, wherein the electrical modulation signal frequency is a sinusoidal signal at a frequency of $(m+(1/k))*f$, where m and k are integers.

21. The apparatus of claim 20, wherein the electrical sinusoidal modulation signal is derived by optically filtering the uniform pulses detected by a photoreceiver using a bandpass optical filter centered at the m-th detected harmonic frequency and combining the m-th detected harmonic with a frequency derived from the fundamental repetition frequency f divided by an integer value k in a frequency divider.

22. An apparatus for digitizing an input electrical signal, comprising: an optical interferometric modulator that modulates an input nonuniform optical pulse sequence by an input electrical signal, the nonuniform optical pulse sequence comprised of L time interleaved wavelength division multiplexed (WDM) uniform pulse streams each of pulse period T, wherein a reference pulse in the sequence can be specified so that the time difference between the reference pulse and at least one other pulse in the sequence is separated by a time delay larger than or approximately equal to $1/(2 \cdot f_{max})$ where $f_{max}$ is the maximum frequency of the input electrical signal and the time difference between the reference pulse and at least one other pulse in the sequence is not in the range of $j \cdot T/L \pm (1/(2 \cdot f_{max}))$ where j is an integer in the range of [1,L−1], the WDM nonuniform pulse sequence being separated by wavelength before detection into wavelength specific uniform pulse streams, the wavelength specific uniform pulse streams being detected by photodetectors and digitized by analog-to-digital converters (ADCs), the digitized pulse streams being processed in a digital signal processor (DSP) to digitize the input electrical signal at the nonuniform sample times.

23. The apparatus of claim 22, wherein M samples of the input signal are used to determine a fixed number of input frequency tones on the input signal with a low probability of ambiguity, wherein the time delay between the reference pulse and the closest interleaved pulse is not less than $$\frac{1}{\sqrt{2M} \cdot 2^{ENOB} \cdot f},$$

where ENOB is the effective number of bits per sample, M is the number of samples processed in the DSP during a measurement interval, and f is 1/T.

24. The apparatus of claim 23, wherein a number of samples to be processed is determined by first estimating the ENOB which the signal is digitized to by analyzing a relatively small number of samples and then extending the number of samples processed appropriately in order for the time delay to meet the constraints.

25. The apparatus of claim 23, wherein the time delay between a reference pulse a first interleaved pulse is $dt_1$, and the time delay between the reference pulse and a second interleaved pulse is $dt_2$, and $dt_1$ and $dt_2$ are approximately related so that $i_1/(dt_1) \sim i_2/(dt_2)$ where $i_1$ and $i_2$ are relatively prime integers, with this relationship expanding the range of input frequencies which lead to a low probability of measurement ambiguity.

26. The apparatus of claim 22, whereas the optical interferometric modulator contains a phase modulator and an optical coupler that combines two copies of the input optical pulse sequence, wherein one of the pulse sequence copies is modulated by the phase modulator, the optical coupler producing two or more output optical signals with a relative combining phase that differs substantially from 180°.

27. The apparatus of claim 26, wherein a subset of the processing parameters determined by processing the known calibration signal are further adjusted by preprocessing samples of the input electrical signal itself, wherein the subset of processing parameters are adjusted so that a fixed number of processed samples of the input signal optimally lie on a unit circle.

28. The apparatus of claim 22, further comprising: a calibration signal of known frequency applied to the interferometric modulator in addition to or instead of the input electrical signal, whereas the DSP analyzes samples from the calibration signal in order to determine optimal parameters used by the DSP to calculate the digitized input electrical signal.

29. The apparatus of claim 28, wherein the calibration signal and the input electrical signal to be digitized are sent to an electrical switch, the electrical switch being controlled by a control unit that selects the calibration signal to be applied during a calibration measurement and the input electrical signal during a signal measurement.

30. The apparatus of claim 22, wherein the time delay between at least one pair of pulses in the sequence is set by a variable delay line that is controllable by a control unit.

31. The apparatus of claim 22, wherein a portion of the input signal is tapped off to a power monitor and results of the power monitor measurements and the signal samples are compared for consistency.

* * * * *